United States Patent

Sato

[11] Patent Number: 5,985,064
[45] Date of Patent: Nov. 16, 1999

[54] CHIP COMPRESSION-BONDING APPARATUS AND METHOD

[75] Inventor: Seiichi Sato, Chikushino, Japan

[73] Assignee: Matsushita Electric Industrial Co., Ltd., Osaka, Japan

[21] Appl. No.: 08/980,201

[22] Filed: Nov. 28, 1997

[30] Foreign Application Priority Data

Nov. 28, 1996 [JP] Japan .................................. 8-317352
Nov. 28, 1996 [JP] Japan .................................. 8-317353

[51] Int. Cl.⁶ ........................... B32B 31/00; B23K 31/02
[52] U.S. Cl. ........................... 156/64; 156/360; 156/362; 156/363; 156/538; 228/179.1; 228/180.21; 228/180.22; 228/235.1
[58] Field of Search ............................... 156/64, 91, 230, 156/234, 235, 250, 251, 360, 362, 363, 351, 355, 538; 228/6.2, 44.7, 49.5, 105, 179.1, 180.21, 180.22, 234.1, 235.1

[56] References Cited

U.S. PATENT DOCUMENTS 4,899,921  2/1990  Bendat et al. ........................... 228/105
5,462,217  10/1995 Simmons et al. ................... 228/180.22

*Primary Examiner*—David A. Simmons
*Assistant Examiner*—J. A. Lorengo
*Attorney, Agent, or Firm*—Stevens, Davis, Miller & Mosher, L.L.P.

[57] ABSTRACT

A chip compression-bonding apparatus includes a vertically-movable block which is vertically moved by a descending device, and has a load measurement device and a load applying device mounted thereon. A compression-bonding tool for holding a chip is provided beneath the vertically-movable block. The weight of the compression-bonding tool is supported by the load measurement device, and the compression-bonding tool is pressed against the load measurement device by the load applying device. A control portion detects a compression-bonding force of the compression-bonding tool by an amount of reduction of the value of the load measured by the load measurement device, and controls the descending device in accordance with the detected compression-bonding force.

7 Claims, 3 Drawing Sheets

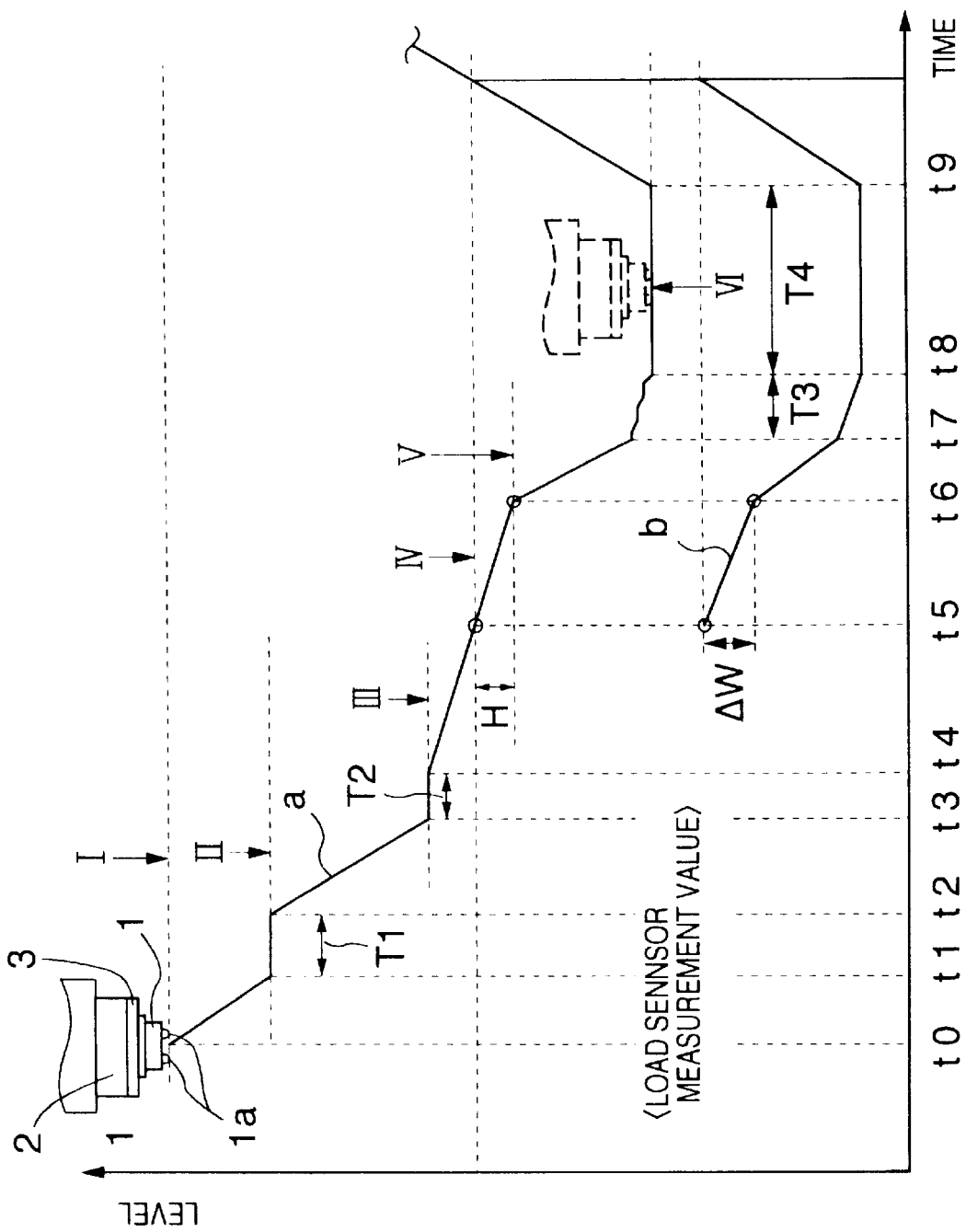

CHIP COMPRESSION-BONDING APPARATUS AND METHOD

BACKGROUND OF THE INVENTION

This invention relates to an apparatus for and a method of mounting a chip on a circuit board by compression-bonding.

In one conventional method of mounting a chip with bumps, such as a flip chip, on a substrate or circuit board, the bumps are pressed against electrodes of a circuit pattern, formed on a surface of the board, and are connected thereto. In this method, it is necessary to strictly control the value of a load, applied to each bump, as well as a load distribution for each bump, and there is known a method in which when compression-bonding the chip to the board, a compression-bonding load value is measured, and the load is applied while comparing this load value with a target load value. Load measurement means, such as a load cell, is used for this load measurement, and is incorporated in a mechanism of the chip compression-bonding apparatus for transmitting the compression-bonding load.

In the above conventional method, however, the load measurement means is arranged serially in the load transmission mechanism, and a compression-bonding tool, which is pressed through the load measurement means, is held by a spring or the like, and therefore there has been encountered a problem that it is difficult to accurately measure a very small load.

A load sensor, such as a load cell, for measuring a load value requires a certain degree of response time, and also a signal transmission delay is involved in a control system. Therefore, during the time period from inputting of the measured value into a control portion to outputting of a new instruction from the control portion, a downward movement of the compression-bonding tool is obliged to be stopped, and the downward movement and the stop for measurement are alternately repeated little by little. As a result, the downward movement at high speed can not be realized, and the tact time can not be reduced, which leads to a problem that the efficiency of mounting of chips can not be enhanced.

SUMMARY OF THE INVENTION

It is therefore a primary object of the invention to provide a chip compression-bonding apparatus and a chip compression-bonding method in which a compression-bonding force can be accurately controlled.

Another object of the invention is to provided a chip compression-bonding method in which a chip can be compression-bonded to a substrate at a high speed.

According to one aspect of the invention, there is provided a chip compression-bonding apparatus comprising a compression-bonding unit comprising a compression-bonding tool having at its lower end a nozzle for holding a chip; a vertically-movable block which is vertically moved by a descending unit; a load measurement unit interposed between the compression-bonding tool and the vertically-movable block; and a load applying unit mounted on the vertically-movable block to apply a predetermined pressing force to the load measurement unit through the compression-bonding tool; wherein the load measurement unit is so arranged that a weight of the compression-bonding tool and the pressing force, applied by the load applying unit, act on the load measurement unit as a preload.

According to another aspect of the invention, there is provided a chip compression-bonding method comprising the steps of: causing a weight of a compression-bonding tool and a pressing force, applied by a load applying unit, to act on a load measurement unit as a preload; holding a chip by a nozzle of the compression-bonding tool; recognizing the position of a substrate and the position of the chip, held by the compression-bonding tool, and bringing the substrate and the chip into registry with each other; lowering a vertically-movable block, having the load applying unit mounted thereon, by a lowering unit, thereby descending the compression-bonding tool toward the substrate and detecting a compression-bonding force by a difference between the preload and a value of a load measured by the load measurement unit, and compression-bonding the chip to the substrate while controlling the descending unit in accordance with the compression-bonding force.

According to a further aspect of the invention, there is provided a chip compression-bonding method comprising the steps of: driving a descending unit to lower a compression-bonding tool, having a chip held at its lower end, to press the chip against a substrate, and finding, by a load measurement unit, the amount of increase of a compression-bonding force during a stroke of the compression-bonding tool from a level at which the chip is brought into contact with the substrate to a first target descending level; calculating a ratio of a descending amount during the stroke to the increase amount; calculating a second target descending level, at which a target compression-bonding force is obtained, in accordance with the ratio; and lowering the compression-bonding tool toward the second target descending level, thereby compression-bonding the chip to the substrate.

BRIEF DESCRIPTION OF THE DRAWINGS

FIG. 3 is a time chart of the operation of the apparatus of FIG. 1; and

DESCRIPTION OF THE PREFERRED EMBODIMENT

According to the invention, load measurement unit or means can be provided in a compression-bonding load transmission mechanism without use of a spring or the like therein, and therefore even a very small load can be accurately measured. And besides, a chip can be compression-bonded to a circuit board at a high speed.

Figure 1:
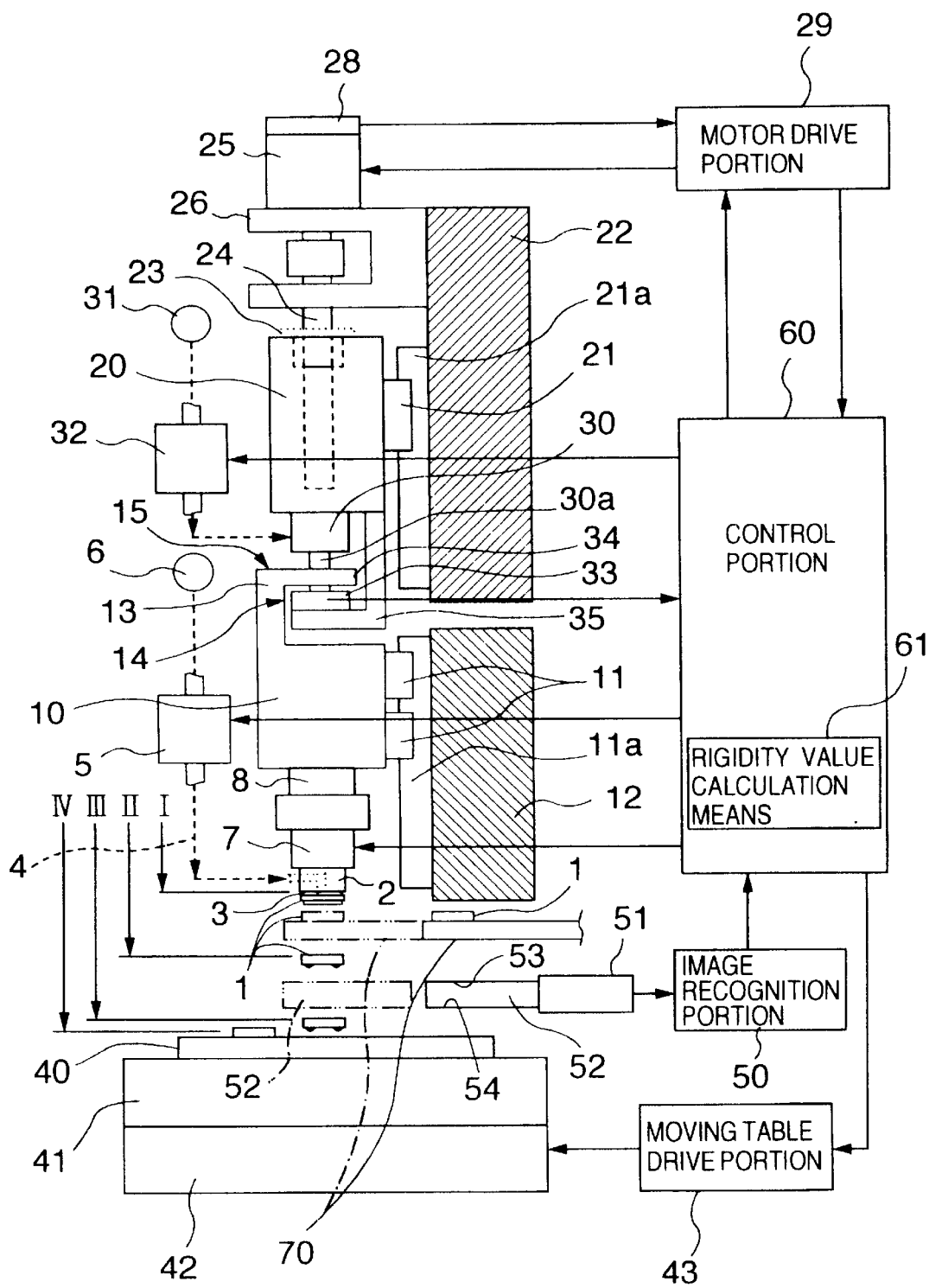
FIG. 1 is a side view of the chip compression-bonding apparatus according to an embodiment of the invention.
Figure 4:
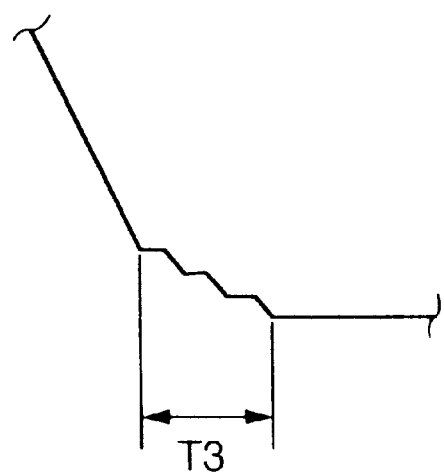
FIG. 4 is a view showing a portion of the time chart of FIG. 3 on an enlarged scale.

An embodiment of the invention will now be described with reference to the drawings. FIG. 1 is a side view of the chip compression-bonding apparatus according to an embodiment of the invention, FIG. 2 is a fragmentary side view of the apparatus, showing a chip suction-holding portion, FIG. 3 is a time chart of the operation of the apparatus, and FIG. 4 is a view showing a portion of the time chart on an enlarged scale.

First, the construction of the chip compression-bonding apparatus will be described. In FIG. 1, a chip 1 is held by suction or vacuum on a lower surface of a nozzle 3 which is provided at a lower side of a nozzle holding portion 2. The chip 1 has bumps 1a formed on a lower surface thereof, see FIG. 2, and the bumps 1a are compression-bonded to electrodes on the circuit surface of a substrate or circuit board.

Figure 2:
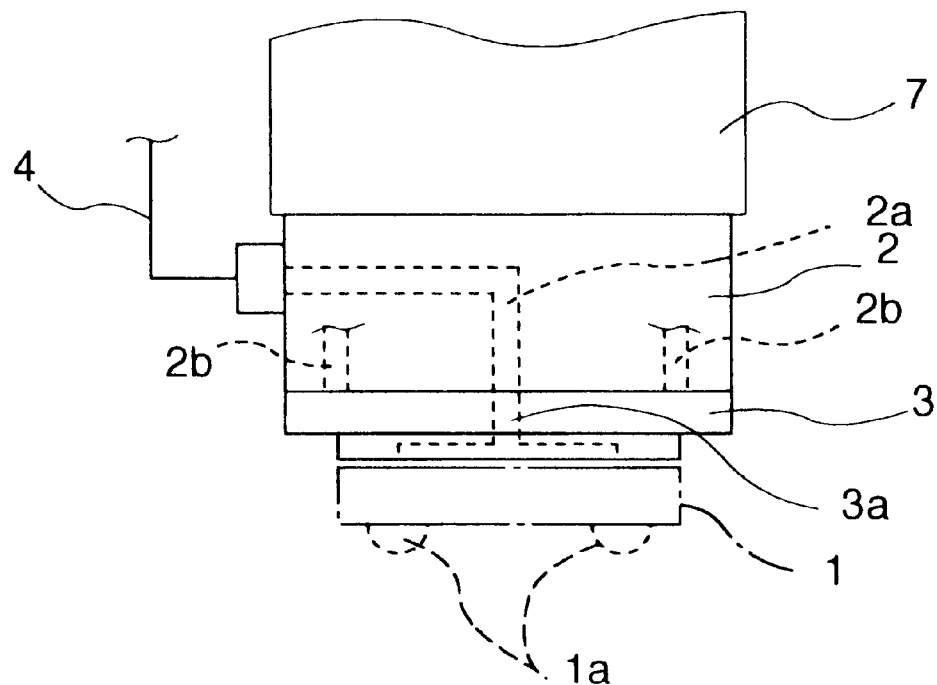
FIG. 2 is a fragmentary side view of the apparatus of FIG. 1, showing a chip suction-holding portion.

FIG. 2 shows the nozzle holding portion 2 and the nozzle 3. In FIG. 2, the nozzle 3 is a thin, plate-like part and is brought into intimate contact with the upper surface of the chip 1 to hold the chip 1 by suction. A first suction passage 2a is formed in a central portion of the nozzle holding portion 2. This first suction passage 2a is in communication with a suction port 3a formed in the nozzle 3. Therefore, by evacuating the suction passage 2a, the chip 1 can be held on the lower surface of the nozzle 3 by suction.

Second suction passages 2b are formed in the nozzle holding portion 2. By evacuating the second suction passages 2b, the nozzle 3 can be releasably held on the lower surface of the nozzle holding portion 2 by suction, and when this evacuation is stopped, the nozzle 3 is detached from the nozzle holding portion 2. As shown in FIG. 1, a vacuum pipe 4 is connected to the suction passage 2a, and also is connected to a vacuum source 6 via an on-off valve 5.

In FIG. 1, a heat block 7 is provided on the upper side of the nozzle holding portion 2. The heat block 7 is electrically controlled by a control portion 60, and heats the chip 1 through the nozzle holding portion 2 and the nozzle 3. The heat block 7 is mounted on a shaft 8, and the shaft 8 is mounted on a first vertically-movable block 10. The nozzle holding portion 2, the nozzle 3, the heat block 7, the shaft 8 and the first vertically-movable block 10 jointly constitute a compression-bonding tool for compression-bonding the chip to the board 40.

Sliders 11 are mounted on a rear surface of the first vertically-movable block 10, and are slidably fitted on a vertical guide rail 11a which is mounted on a front surface of a first frame 12. Therefore, the first vertically-movable block 10 moves upward and downward along the guide rail 11a. An extension portion 13 of an inverted L-shape is formed on an upper end of the first vertically-movable block 10, and a lower surface 14 of this extension portion 13 is held in contact with a load sensor 33, which serves as load measurement means, so as to transmit a load as will be described later.

A second vertically-movable block 20 is provided above the first vertically-movable block 10. A slider 21 is mounted on a rear surface of the second vertically-movable block 20, and is slidably fitted on a vertical guide rail 21a which is formed on a front surface of a second frame 22. Therefore, the second vertically-movable block 20 moves upward and downward along the guide rail 21a.

A bracket 26 of a U-shaped cross-section is mounted on an upper end portion of the second frame 22. A motor 25 is mounted on the bracket 26. A vertically-disposed feed screw 24, which is driven by the motor 25, is threaded in a nut 23 provided in the second vertically-movable block 20. Therefore, when the motor 25 is rotated in its normal and reverse directions, the feed screw 24 is rotated in its normal and reverse directions, so that the nut 23 moves upward and downward along the feed screw 24, and the second vertically-movable block 20 and the first vertically-movable block 10 are moved upward and downward. Namely, the motor 25, the feed screw 24, the nut 23 and so on jointly constitute descending means for vertically moving the compression-bonding tool.

A motor drive portion 29 is connected to the motor 25. Receiving instructions from the control portion 60, the motor drive portion 29 controls the rotational speed of the motor 25, and also feeds a rotational speed signal, which is representative of the rotational speed of the motor 25 and fed from an encoder 28, to the control portion 60.

Next, load applying means for applying a pressing force to the chip 1 through the nozzle 3, as well as the load measurement means, will be described. A cylinder 30, serving as the load applying means, is mounted on a lower surface of the second vertically-movable block 20. A lower end of a rod 30a of the cylinder 30 is connected to the extension portion 13, and therefore when the rod 30a is extended, the cylinder 30 transmits a predetermined force to an upper surface 15 of the extension portion 13 of the first vertically-movable block 10. A regulator 32 is connected to the cylinder 30, and adjusts an air pressure fed from an air supply source 31, so that the predetermined pressing force can be obtained. The load measurement means comprises the load sensor 33 such as a load cell, and is mounted on an extension portion 35 which is formed at a lower end of the second vertically-movable block 20.

The load sensor 33 is so arranged that its load detection end 34 contacts the lower surface 14 of the extension portion 13, and receives a measured load through this lower surface 14 of the extension portion 13. With this arrangement, the sum of the pressing force of the cylinder 33 and the weight of the first vertically-movable block 10, including the weights of the nozzle holding portion 2, the shaft 8 and so on, acts on the load sensor 33 as a preload. When the chip 1 is compression-bonded to the board 4, the value of the load, measured by the load sensor 33, is reduced by an amount corresponding to a reaction force from the mounting surface of the board, and this reduction amount corresponds to the compression-bonding force, and therefore the compression-bonding operation is carried out while monitoring the decrease of the value of the load measured by the load sensor 33.

A moving table 42 is provided below the nozzle 3. A board holder 41 is mounted on the moving table 42, and the circuit board 40 is placed and held on the board holder 41. The moving table 42 is connected to the control portion 60 via a moving table drive portion 43. By driving the moving table 42, the board 40 can be horizontally moved in a direction X, a direction Y and a direction θ, so that the position of the board 40 can be adjusted.

Next, means for supplying the chip 1 to this chip compression-bonding apparatus will be described. In FIG. 1, a supply table 70 for supplying the chip 1 is provided below the first frame 12. The supply table 70 is driven to be moved forward and backward by drive means (not shown), and passes the chip 1 to the nozzle 3 when the supply table 70 is located in a position indicated by a dot-and-dash line in FIG. 1.

A camera 51 is provided below the first frame 12. This camera 51 is a CCD camera. The camera 51 includes a tube or lens barrel which can be extended forward. A lens 53 and a lens 54 are provided respectively at upper and lower surfaces of a distal end portion of the tube 52. The tube 52 is driven to be moved forward and backward by drive means (not shown), and the tube 52 can move into a position between the chip 1, suction-held by the nozzle 3, and the board 40, see the tube 52 indicated by a dot-and-dash line in FIG. 1, and the position of the chip 1 is recognized through the lens 53 while the position of the board 40 is recognized through the lens 54.

An image recognition portion 50 is connected to the camera 51, and is also connected to the control portion 60. Image data, picked up by the camera 51, is fed to the image recognition portion 50. The image recognition portion 50 recognizes the image data, and feeds necessary data to the control portion 60.

Next, the control portion 60 will be described. The control portion 60 obtains the rotational speed signal, which is representative of the rotational speed of the motor 25, from the motor drive portion 29, the value of the measured load from the load sensor 33, the position data of the board 40 and the position data of the chip 1 from the image recognition portion 50, and in accordance with a control sequence, the control portion 60 controls the driving of the motor 25, the ON-OFF operation of the chip suction-holding valve 5, and a heating current in the heat block 7. The control portion 60 includes rigidity value calculation means for calculating a rigidity value, which will be described later, based on measured data obtained at an initial stage of the compression-bonding operation.

The chip compression-bonding apparatus has the construction described above, and its operation will now be described with reference to the drawings. In FIG. 1, the chip 1 is supplied from the supply table 70 located below the first frame 12. Then, the nozzle 3 descends from a standing-by level (I), and holds the chip 1 by suction. Then, the nozzle 3, suction-holding the chip 1, ascends to the standing-by level (I), and the empty supply table 70, which has passed the chip 1 to the nozzle 3, is returned to the position indicated in a solid line in FIG. 1. In this condition, the preload F0=A+B, which is represented by the sum of the pressing force A of the cylinder 30 and the weight B of the first vertically-movable block 10, including the weights of the nozzle holding portion 2, the shaft 8 and so on, acts on the load sensor 33, as described above.

The operation of the chip compression-bonding apparatus will be described with reference to FIG. 1 and FIG. 3 which shows a time chart. In the time chart of FIG. 3, the abscissa axis represents time, and the ordinate axis represents the height or level of the bumps 1a of the chip 1 suction-held by the nozzle 3. A solid line a represents the movement of the chip 1 in accordance with the vertical movement of the nozzle 3. However, when the nozzle 3 is moved upward after the compression-bonding operation is finished, the chip 1 is not present at the lower end of the nozzle 3. A solid line b represents the value of the load measured by the load sensor 33 at the same time. (I) represents the standing-by level, (II) represents a primary stop level, (III) represents a secondary stop level immediately before the chip 1 contacts the mounting surface, i.e., the upper surface of the board 40, (IV) represents a level of the mounting surface, (V) represents a first target descending level, and (VI) represents a final target descending level, i.e., second target descending level.

In FIG. 3, at a timing T0, the nozzle 3, suction-holding the chip 1, is disposed at the standing-by level (I). Upon reception of an instruction to initiate the compression-bonding operation, the nozzle 3 begins to descend at high speed, and then once stops at the primary stop level (II) at a timing t1. During this stop time period T1, the camera 51 moves forward, and when the lenses 53 and 54 reach a position beneath the chip 1, the images begin to be picked up, and the image data of the surface of the chip 1 having the bumps 1a formed thereon, as well as the image data of the mounting surface of the board 40 disposed below this chip surface, is picked up. These image data are fed to the image recognition portion 50, and in accordance with these image data, the image recognition portion 50 recognizes the position of the chip 1 and the position of the board 40, and feeds results thereof to the control portion 60. In accordance with this position information, the control portion 60 feeds a necessary position correction instruction to the moving table drive portion 43. In accordance with this instruction, the moving table drive portion 43 drives the moving table 42, thereby registering the electrodes on the board 40 with the bumps 1a, respectively.

Thereafter, the camera 51 is retracted and returned to its initial position, and at a timing t2, the nozzle 3 again begins to descend at high speed, and at a timing t3, the nozzle 3 stops at the secondary stop level (III) slightly above the level (IV) of the mounting surface. At a timing t4 at which a delay time T2 elapses, the nozzle 3 begins to descend at a low speed, that is, a predetermined contact point search creep speed. During this downward movement, the bumps 1a on the chip 1 are brought into contact with the mounting surface (IV) of the board 40, and subsequently the nozzle 3 continues to descend while pressing the bumps 1a against the mounting surface.

A reaction force of this pressing force or compression-bonding force W is transmitted to the first vertically-movable block 10 via the nozzle holding portion 2 and the shaft 8. This reaction force increases as the second vertically-movable block 20 descends, and this increase amount represents an amount of reduction of the value of the load measured by the load sensor 33. Therefore, if the value of the measured load is represented by F, the compression-bonding force W is expressed by a formula, W=F0−F. Namely, the descending operation is controlled while monitoring the value of F by the control portion 60 so that the value of W can become the target compression-bonding force.

The descent or downward movement at this contact point search creep speed is continued until the first target descending level (V). During the stroke from the mounting surface level (IV) to the first target descending level (V), that is, during the time period from a timing t5 to a timing t6, the value of the load, measured by the load sensor 33, is inputted into the control portion 60. As described above, the amount of reduction of the measured load value corresponds to the compression-bonding force, and therefore the control portion 60 calculates a difference ΔW between the measured load value at the mounting surface level (IV) and the measured load value at the first target descending level (V), and calculates the rigidity value represented by the ratio ΔW/H of the difference to the descending amount H during this stroke.

In accordance with this rigidity value, the control portion 60 effects a calculation to determine how much the nozzle 3 should be further lowered so as to obtain the target compression-bonding force, and thus finds the final target descending level (VI), that is, the second target descending level. Then, the control portion 60 sends an instruction to cause the motor drive portion 29 to descend the nozzle 3 continuously to a level immediately before the second target descending level without stopping the nozzle 3 for sampling the measured load value.

At a timing t7, the continuous descent or downward movement of the nozzle 3 is stopped at the predetermined level slightly above the second target descending level (VI). Thereafter, during a time period T3, the nozzle 3 descends little by little, that is, the stop of the nozzle 3 for sampling the value of the load, measured by the load sensor 33, and the downward movement of the nozzle 3 are alternately repeated, see FIG. 4, until the compression-bonding load reaches its target value. Then, at a timing t8 when the measured load value reaches a value, satisfying the target compression-bonding force, the control portion 60 sends an instruction to stop the downward movement, and thereafter the nozzle 3 is stopped for a predetermined pressure-holding time T4.

At a timing t9 when the pressure-holding time T4 elapses, the nozzle 3 begins to ascend at low speed. At this time, a vacuum breaker has already been opened, and therefore the chip 1 is released from the suction-held condition. Then, the nozzle 3 is switched from the low-speed upward movement to a high-speed upward movement, and is returned to the standing-by level (I), and thus one cycle of the compression-bonding operation is completed.

The present invention is not limited to the above embodiment. For example, in the above embodiment, although during the time period T3, the nozzle 3 is lowered little by little while sampling the measured load value, thereby compression-bonding the chip to the board 40, this little-by-little downward movement is not always necessary, but the nozzle 3 may be continuously lowered to the second target descending level. However, when this little-by-little downward movement is effected for a short time, the chip 1 can be more positively compression-bonded to the board 40 with a desired force without applying an excessive compression-bonding load to the chip 1. In this case, the time required for this little-by-little downward movement is short, and therefore the tact time can be greatly reduced.

In the invention, the load measurement means is provided in the compression-bonding load transmission mechanism without using a spring or the like therein, and therefore even a very small compression-bonding load can be measured accurately.

What is claimed is:

1. A chip compression-bonding method in which a compression-bonding tool, having a chip held at its lower end, is moved downward to press the chip against a substrate, thereby compression-bonding the chip to the substrate, said method comprising the steps of:

causing a weight of the compression-bonding tool and a pressing force, applied by load applying means, to act on load measurement means as a preload;

holding the chip by a holding means of the compression-bonding tool;

recognizing a position of the substrate and a position of the chip, held by the compression-bonding tool, and bringing the substrate and the chip into registry with each other;

lowering a vertically-movable block, having the load applying means mounted thereon, by descending means, thereby lowering the compression-bonding tool toward the substrate; and detecting a compression-bonding force by a difference between the preload and a value of a load measured by the load measurement means, and compression-bonding the chip to the substrate while controlling the descending means in accordance with the compression-bonding force.

2. A chip compression-bonding method comprising the steps of:

driving descending means to lower a compression-bonding tool, having a chip held at its lower end, to press the chip against a substrate, and finding, by load measurement means, an amount of increase of a compression-bonding force during a stroke of the compression-bonding tool from a level at which the chip is brought into contact with the substrate to a first target descending level;

calculating a ratio of a descending amount during the stroke to said amount of increase;

calculating a second target descending level, at which a target compression-bonding force is obtained, in accordance with the ratio; and lowering the compression-bonding tool toward the second target descending level, thereby compression-bonding the chip to the substrate.

3. A chip compression-bonding apparatus comprising:

substrate positioning means for positioning a substrate;

compression-bonding means for holding a chip and for compression-bonding the substrate to the substrate held by said substrate positioning means;

recognition means for recognizing a position of the substrate, held by said substrate positioning means, and a position of the chip held by said compression-bonding means; and registering means for driving said substrate positioning means in accordance with the positions of the substrate and the chip, recognized by said recognition means, to bring the substrate into registry with the chip;

wherein said compression-bonding means comprises:

a compression-bonding tool having at its lower end a holding means for holding the chip;

a vertically-movable block which is vertically moved by descending means;

load measurement means interposed between said compression-bonding tool and said vertically-movable block; and load applying means mounted on said vertically-movable block to apply a predetermined pressing force to said load measurement means through said compression-bonding tool;

wherein said load measurement means is so arranged that a weight of said compression-bonding tool and the pressing force, applied by said load applying means, act on said load measurement means as a preload.

4. Apparatus according to claim 3, further comprising compression-bonding force control means by which the compression-bonding force is detected by a difference between the preload and a value of a load measured by said load measurement means, and said descending means is controlled in accordance with the compression-bonding force.

5. Apparatus according to claim 3, wherein said load applying means comprises a cylinder.

6. Apparatus according to claim 1, wherein said holding means is a nozzle.

7. Method according to claim 4, wherein said holding means is a nozzle.

* * * * *